United States Patent [19]
Yeo et al.

[11] Patent Number: 5,199,034
[45] Date of Patent: Mar. 30, 1993

[54] APPARATUS AND METHOD FOR TESTING SEMICONDUCTORS FOR CELL TO BITLINE LEAKAGE

[75] Inventors: Ignatius Yeo; Eileen W. L. Kam, both of Singapore, Singapore

[73] Assignee: Texas Instruments Incorporated, Dallas, Tex.

[21] Appl. No.: 636,817

[22] Filed: Dec. 31, 1990

[51] Int. Cl.$^5$ .............................................. G06F 11/00
[52] U.S. Cl. ................................ 371/21.2; 371/21.3; 365/201
[58] Field of Search ............. 365/201; 371/21.1, 21.2, 371/21.3, 13, 15.1, 22.6

[56] References Cited

U.S. PATENT DOCUMENTS

| | | | |
|---|---|---|---|
| 4,956,816 | 9/1990 | Atsumi et al. | 371/21.2 |
| 5,060,230 | 10/1991 | Arimoto et al. | 371/21.2 |
| 5,079,744 | 1/1992 | Tobita et al. | 371/21.2 |

Primary Examiner—Vincent P. Canney
Attorney, Agent, or Firm—W. James Brady, III; B. Peter Barndt; Richard L. Donaldson

[57] ABSTRACT

A method of testing for cell to bitline leakage using an improved algorithm is disclosed. A selected portion of the bitlines, both true and complement, are changed. In this manner, the entire memory can be tested without regard to memory size. The prior algorithm used to perform this same function on a megabit dram would take about 570 seconds. The new procedure performs the same function in a more efficient manner, resulting in a test time of approximately 2.8 seconds which is over 200 times faster.

5 Claims, 1 Drawing Sheet

APPARATUS AND METHOD FOR TESTING SEMICONDUCTORS FOR CELL TO BITLINE LEAKAGE

TECHNICAL FIELD OF THE INVENTION

The present invention pertains to the testing of semiconductor devices and more particularly to a system and method for reducing the testing time.

BACKGROUND OF THE INVENTION

Traditional semiconductor dram cell failure has been found to be predominantly due to leakage to the substrate and leakage to the wordline due to poor gate oxide integrity which in turn is due to process defects. The problem is present in systems up to the megabit level. Many test algorithms are available today which identify those devices which are marginal to such defects. With the shrinking of the transistor channel length (sub micron) from 4 mb and beyond, leakage from cell to bitline is becoming a significant factor.

Prior arrangements have been devised to test for such a failure mechanism. However, the test time taken is much too long, making it difficult to implement in a production type test program.

Accordingly, a need exists in the art for a test system and method which tests for leakage between cell and bitline and which does so in a minimum amount of time.

A further need exists in the art for such a system which insures that all cell/bitlines have been exercised and tested.

SUMMARY OF THE INVENTION

In the present system, all cells are distributed and tested in serial fashion, row by row. This invention calls for a simpler algorithm to perform the same function at 0.5% of the original test time, by performing the disturb function on four selected rows instead of the entire 1024 rows of the memory array. The objective of the algorithm is to check for leakage between the cell and bitline.

The reduced test time is achieved by the following system and method:

Begin by writing a background of data; then write to one row of the opposite data state. Then continuously read that row for some specified amount of time. After disturbing the column, rewrite the disturb row with the background data and reread the entire array again.

Next, write to another row of the opposite data state. Again, continuously read that row for some specified amount of time. After disturbing the column, rewrite the disturbed row with the background data and read the entire array again.

The above is repeated with two rows on the other side of sense amp and again all of the above steps are repeated with the opposite data state.

This system tests the entire array and reduces the test time dramatically.

Accordingly, it is one feature of this invention to exercise only a selected number of rows of a memory in order to insure that the entire memory is functioning properly.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
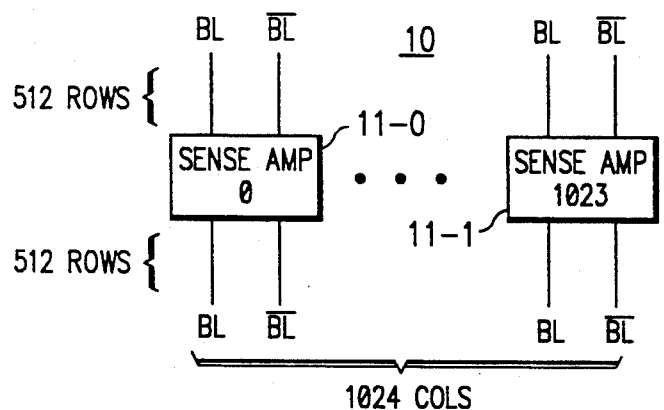
FIG. 1 shows an example of a megabit memory layout.

As shown in FIG. 1, memory 10 is organized as 1024 rows by 1024 columns with 512 rows on one side of each sense amp 11- (upper half) and another 512 rows on the other side of the sense amp (lower half). In memory 10, which can be a dynamic random access memory (DRAM), this could be a 1 meg DRAM with folded bit line architecture with an 8 ms refresh time. Half the cells in the memory are connected such that they store data that is the same (true) as the data that is supplied to its input data pin and the other half will store data that is the opposite complement.

A column is made up of two bit lines connected to a sense amplifier, such as amplifier 11-0. Cells (as will be discussed) connected to bitlines BL will store true data while cells connected to bitline-bar $\overline{BL}$ will store the complement data.

When a row is selected/activated, all cells (1024) connected to that row are activated. This implies that all columns in that half (upper or lower half of the array, separated by sense amp 11-) would also be activated as shown. Half of the rows will connect to cells storing true data and half of the cells will connect to cells storing complement data.

Figure 2:
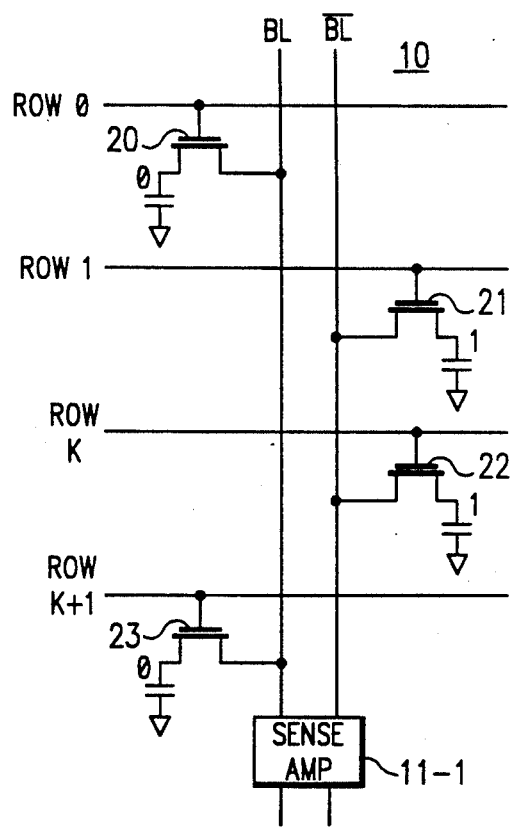
FIG. 2 shows in detail the cell layout at a bit line.

FIG. 2 shows an expanded view of certain cells 20, 21, 22, 23 of memory 10.

K, in FIG. 2, represents row 510 and K+1 will represent row 511. There are another 508 rows between row 1 and row K. What is shown in FIG. 2 is one column of just four rows as an example. The structure immediately next to the digits 1 or 0 represents the cells storing the data. There are one million of these in the entire memory array.

As shown row 0 will select all cells (20) connected to cells connected to BL and hence store true data. Row 1 will select all cells connected to $\overline{BL}$ and hence store complement data.

When a row is activated, all 1024 cells are initially read or sensed to detect whether a 1 or 0 is stored in the cells.

This will place a 1 or 0 on the column bitlines BL and the complement data on the complement bitlines $\overline{BL}$ when the sense amplifier has completed its job of detection.

Existing Method

A background of data is written followed by one row of the opposite data. That row is continuously read for some specified amount of time. After this disturbance of the column, the disturbed row is rewritten with the background data and the entire array reread.

The test is repeated for each row and for both (true and complement) data states. In detail, the steps are:

(1) Write a background of zeros.
(2) Write ones into the first row.
(3) Set a timer for the refresh time (8 ms). Read the first row, starting from column 0 to column 1023 continuously, for 8 ms which is controlled by the timer. We do not expect an error here as the purpose of this step is to disturb all other cells connected to the other rows. We thus only expect to see errors on the other cells, which would be in step 5 when the array is read.

(4) Write zeros into the first row. This is to write the original data (background condition, i.e., 0's) back into the first row.

(5) Read the array. This is to read the whole memory array to check if step 3 has caused the stored data to be incorrect or corrupted. In this example, the system tries to read the original 0's that have been written into each cell in the entire memory array (step 1). If a one is detected instead of a zero in any cell, an error would have occurred, and the memory would fail this test. This error would have been caused by the process in step 3.

(6) Repeat steps 2, 3, 4 and 5 for each row.

(7) Repeat steps 1 through 6 for the opposite data. Opposite data here means going back to step 1 and this time writing a background of one instead of zero as in the original condition. Steps 2–6 are repeated, but each one is replaced with a zero and vice versa. In this manner, the system checks for background of zero being disturbed by data one's (steps 1–6) and vice versa (step 7).

Using the original method the test time is as follows:

$$= [(N \times \# \text{ROWS} + 3N) \times \text{CYCLE TIME} + (\# \text{ROWS} \times \text{REFRESH TIME})] \times 2$$
$$= [(2^{20} \times 1024 + 3 \times 2^{20})260 \times 10^{-9} + (1024 \times 8 \times 10^{-3})] \times 2$$
$$= 576.4 \text{ SECS}.$$

Where n = memory size and Cycle time is 260 ns ($260 \times 10^{-9}$)

New Method

We have observed that by writing ones onto the BL bitline all of the cells connected to that bitline which are stored with zeros during the active period of the memory cycle will be stressed. Similarly, writing one into $\overline{BL}$ will stress all cells connected to bitline bar which are stored with a zero.

In addition, selecting a cell on a row turns on all cells connected to that row. This will activate all sense amps connected to the same BL on the same sense amp side. Therefore, by testing two rows on each side of the sense amp, the entire memory can be checked for leakage between cells and bitlines.

Figure 3:
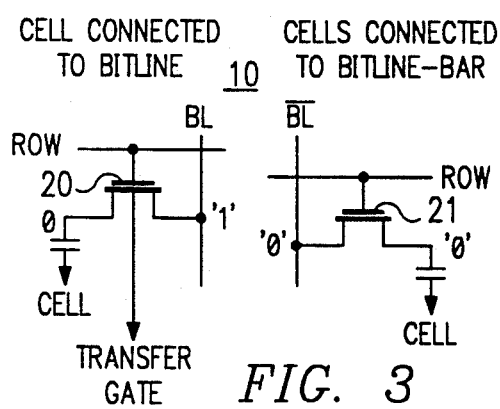
FIGS. 3 and 4 show various conditions of the bit line cell.

A step-by-step procedure of the above discussed concept on a megabit dram would then be:

(1) Write a background of all zeros (2) Write a one into a row connecting to cells storing true data, eg. row 0 in FIG. 2. This will put a one on BL and a zero on $\overline{BL}$ as shown in FIG. 3. The remainder of the cells from row 1 to row 511 have zeros in them as established by step 1. All cells connected to BL's will see voltage difference between the cell and the respective bit line, i.e., zero versus one, which will stress the transfer gates. All cells connected to bit $\overline{BL}$'s will see no stress between the cell and BL's (zeros versus zeros).

(3) Set a timer for refresh time (8 ms).

(4) Read the stressed row until the time expires. Repeated reading of the same row for 8 ms will cause all cells to be in the modes discussed above. Thus, this will stress the transfer gates of all cells connected to BL's for 8 ms.

(5) Write a zero back into the stressed row.

(6) Read the array. The reading of all the cells in the memory array will assure that they are all zero and will check all cells connected to BL on the upper half of sense amp 11-0 of FIG. 1. If the stress had caused an error, it would not have been refreshed by writing the zeros back into the stressed row, and thus would have presented a "one" to the output.

Figure 4:
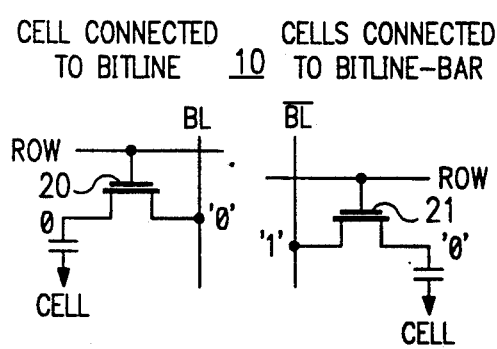

(7) Repeat steps 2 to 6, selecting a row connecting to cells storing complement data on the same side of sense amp as in step 2. All cells connected to $\overline{BL}$ will see stress across the transfer gate between the cell and $\overline{BL}$ (zero versus one). All cells connected to BL will see no stress between the cell and BL. This is shown in FIG. 4. At this point, all cells on the top half of the memory array 10 (FIG. 1) have been stressed.

(8) Repeat steps 2 to 7 on other (bottom) side of sense amp 11-. This will repeat the stress on the lower half of the memory array.

(9) Repeat steps 1 to 8 with the opposite data. This will repeat everything with opposite data, i.e., now the cells will be stored with one and the transfer gate will be stressed by having a zero on the bitline.

Under this new method and system the test time is as follows:

$$= [N \times \text{CYCLE TIME} + [(2N + 4 \text{ ROWS}) \times \text{CYCLE TIME} + 2 \times \text{REFRESH TIME}] \times 2] \times 2]$$
$$= [2^{20} \times 260 \times 10^{-9} + [2 \times 2^{20} + 4 \times 1024) \times 260 \times 10^{-9} + 2 \times 8 \times 10^{-3}] \times 2] \times 2$$
$$= 2.79 \text{ SECS}.$$

This results in a 99.5% reduction over the prior art, which equates to a test time which is 200 times faster than before.

Thus, using this system and method, all the cells would have been stressed and checked in a much shorter time. In addition, all memory sizes will take the same amount of time.

The old procedure achieves the same result, but is repetitive and redundant, as every row (1024) will have to be written to and read from for 8 ms each. In the instant invention, we only write to and read from four rows for 8 ms each while achieving the same objective.

Figure 5:
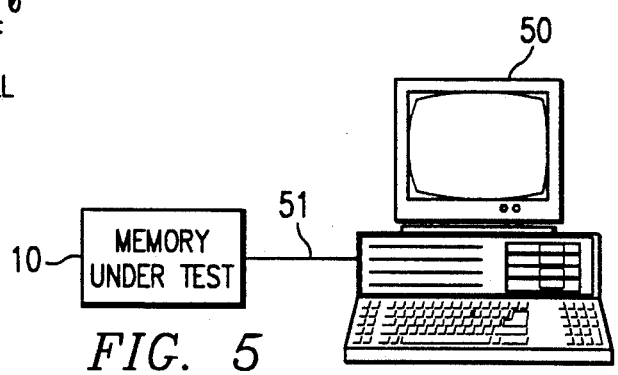
FIG. 5 shows a test system for a memory.

FIG. 5 shows cpu 50 connected to memory 10 by cable 51 and operating in a test mode. Of course, memories of any type can be tested by that system whether or not they are split by sense amplifiers.

Although this description describes the invention with reference to the above specified embodiments, it is but one example, and the claims, not this description, limit the scope of the invention. Various modifications of the disclosed embodiment, as well as alternative embodiments of the invention, will become apparent to persons skilled in the art upon reference to the above description. Therefore, the appended claims will cover such modifications that fall within the true scope of the invention.

What is claimed is:

1. A method for testing leakage between cells and bitlines in a memory, said memory having a plurality of columns arranged as bitlines and as bitline complements, each said column connected to a cell in each row and wherein all of the cells of certain rows are connected to respective bitline columns and all of the cells of certain other rows are connected to respective complement bitline columns, said method comprising the steps of:

1) writing a background of data to all of said cells;
2) writing one of said bitline connected rows with the complement of said data;
3) reading said one bitline row for a period of time corresponding to the refresh time of said memory;
4) writing said one bitline row with said data;
5) reading the entire memory array to ascertain if any cell now contains any complementary data;
6) writing one of said complement bitline rows with said complement of said data;
7) reading said last-mentioned bitline row for a period of time corresponding to the refresh time of said memory;
8) writing said last-mentioned bitline row with said data;
9) reading the entire memory array to ascertain if any cell now contains any complementary data;
10) writing a background of complement data to all of said cells;
11) writing one of said bitline connected rows with said data;
12) reading said one bitline row for a period of time corresponding to the refresh time of said memory;
13) writing said one bitline row with said data complement;
14) reading the entire memory array to ascertain if any cell now contains any data which is not said data complement;
15) writing one of said complement bitline rows with said data;
16) reading said last-mentioned bitline row for a period of time corresponding to the refresh time of said memory;
17) writing said last-mentioned bitline row with said data complement; and
18) reading the entire memory array to ascertain if any cell now contains any data which is not said data complement.

2. The method set forth in claim 1 wherein said columns are divided into sections by a sense amplifier and wherein said method includes the steps of:
first performing said eighteen steps on a first section and then performing said eighteen steps on a second section.

3. The method set forth in claim 2 wherein said rows connected to said bitlines and said rows connected to said complement bitlines are alternating with each other.

4. The method set forth in claim 2 wherein said steps 1-9 for both claims 1 and 2 are performed prior to the performance of steps 10-18 of claims 1 and 2.

5. A test system for testing leakage between cells and bitlines in a memory, said memory having a plurality of columns arranged as bitlines and as bitline complements, each said column connected to a cell in each row and wherein all of the cells of certain rows are connected to respective bitline columns and all of the cells of certain other rows are connected to respective complement bitline columns, said system comprising
a cpu connectable to a memory and including
circuitry for writing a background of data to all of said cells;
circuitry for writing one of said bitline connected rows with the complement of said data;
circuitry for reading said one bitline row for a period of time corresponding to the refresh time of said memory;
circuitry for writing said one bitline row with said data;
circuitry for reading the entire memory array to ascertain if any cell now contains any complementary data;
circuitry for writing one of said complement bitline rows with said complement of said data;
circuitry for reading said last-mentioned bitline row for a period of time corresponding to the refresh time of said memory;
circuitry for writing said last-mentioned bitline row with said data;
circuitry for reading the entire memory array to ascertain if any cell now contains any complementary data;
circuitry for writing a background of complement data to all of said cells;
circuitry for writing one of said bitline connected rows with said data;
circuitry for reading said one bitline row for a period of time corresponding to the refresh time of said memory;
circuitry for writing said one bitline row with said data complement;
circuitry for reading the entire memory array to ascertain if any cell now contains any data which is not said data complement;
circuitry for writing one of said complement bitline rows with said data;
circuitry for reading said last-mentioned bitline row for a period of time corresponding to the refresh time of said memory;
circuitry for writing said last-mentioned bitline row with said data complement; and
circuitry for reading the entire memory array to ascertain if any cell now contains any data which is not said data complement.

* * * * *